(12) United States Patent
Nozokido

(10) Patent No.: US 10,396,726 B2
(45) Date of Patent: Aug. 27, 2019

(54) PREAMPLIFIER FOR MUSICAL INSTRUMENTS

(71) Applicant: ZOOM CORPORATION, Tokyo (JP)

(72) Inventor: Michihito Nozokido, Tokyo (JP)

(73) Assignee: ZOOM CORPORATION, Tokyo (JP)

( * ) Notice: Subject to any disclaimer, the term of this patent is extended or adjusted under 35 U.S.C. 154(b) by 0 days.

(21) Appl. No.: 15/954,945

(22) Filed: Apr. 17, 2018

(65) Prior Publication Data

US 2018/0309418 A1    Oct. 25, 2018

(30) Foreign Application Priority Data

Apr. 21, 2017  (JP) ................................ 2017-084540

(51) Int. Cl.
| | |
|---|---|
| *H03F 3/183* | (2006.01) |
| *G10G 7/02* | (2006.01) |
| *H03G 3/02* | (2006.01) |
| *H03F 3/45* | (2006.01) |

(Continued)

(52) U.S. Cl.
CPC .............. *H03F 3/183* (2013.01); *G10G 7/02* (2013.01); *H03F 3/187* (2013.01); *H03F 3/45071* (2013.01); *H03F 3/45475* (2013.01); *H03G 3/02* (2013.01); *H03G 5/02* (2013.01); *G10H 2210/265* (2013.01); *H03F 2200/03* (2013.01); *H03F 2200/261* (2013.01); *H03F 2200/321* (2013.01); *H03F 2200/481* (2013.01); *H03F 2203/45522* (2013.01)

(58) Field of Classification Search
CPC ...... H03F 3/183; H03F 3/187; H03F 3/45071; H03F 3/45475; H03F 2200/03; H03F 2200/261; H03F 2200/321; H03F 2200/481; H03F 2203/45522; G10G 7/02; H03G 3/02; H03G 5/02; G10H 2210/265
USPC ................. 381/118, 120, 104, 101, 102, 107
See application file for complete search history.

(56) References Cited

U.S. PATENT DOCUMENTS

| | | | | |
|---|---|---|---|---|
| 5,821,889 A | * | 10/1998 | Miller ................... | H03M 1/185 341/139 |
| 7,337,026 B2 | * | 2/2008 | Lin ........................ | H03G 3/002 381/104 |

(Continued)

FOREIGN PATENT DOCUMENTS

| | | |
|---|---|---|
| JP | 2006208954 A | 8/2006 |
| JP | 200876758 A | 4/2008 |

*Primary Examiner* — Ahmad F. Matar
*Assistant Examiner* — Sabrina Diaz
(74) *Attorney, Agent, or Firm* — The Webb Law Firm

(57) ABSTRACT

A preamplifier for musical instruments includes: an operational amplifier 40 to amplify an inputted analog audio signal; a dual-unit variable resistor 30 to change an amplification factor of the operational amplifier 40 by manually operating an operation unit; an A/D converter 51 to convert the amplified analog audio signal to a digital audio signal; and a digital signal processor 60 to digital-signal process the digital audio signal, wherein the dual-unit variable resistor 30 includes a second variable resistor 32 to output a detection signal in accordance with an amount of operation of the operation unit, and the digital signal processor 60 is capable of implementing, based on a value of the detection signal, a first digital gain process to amplify the digital audio signal and/or a second digital gain process to attenuate the digital audio signal.

20 Claims, 7 Drawing Sheets

(51) Int. Cl.
*H03G 5/02* (2006.01)
*H03F 3/187* (2006.01)

(56) References Cited

U.S. PATENT DOCUMENTS

| | | | |
|---|---|---|---|
| 2005/0190930 A1* | 9/2005 | Desiderio | H03G 5/04 |
| | | | 381/103 |
| 2008/0072739 A1 | 3/2008 | Ueno et al. | |
| 2008/0295676 A1 | 12/2008 | Yamada | |
| 2013/0205978 A1* | 8/2013 | Yamabata | G10H 1/18 |
| | | | 84/616 |
| 2014/0150630 A1* | 6/2014 | Juszkiewicz | G10H 1/44 |
| | | | 84/626 |
| 2014/0219477 A1* | 8/2014 | Scott | H03F 3/183 |
| | | | 381/118 |

* cited by examiner

Prior Art

PREAMPLIFIER FOR MUSICAL INSTRUMENTS

CROSS-REFERENCE TO RELATED APPLICATION

This application claims priority to Japanese Patent Application No. 2017-084540 filed Apr. 21, 2017, the disclosure of which is hereby incorporated in its entirety by reference.

BACKGROUND OF THE INVENTION

Field of the Invention

The present invention relates to a preamplifier for musical instruments and particularly relates to a preamplifier for musical instruments suitable for acoustic musical instruments.

Description of Related Art

Acoustic musical instruments, such as wind instruments, stringed instruments, percussion instruments, and keyboard instruments, are capable of making a sound from themselves while, when played on a large stage or the like, such an acoustic musical instrument is provided with a pickup or a microphone to obtain an analog audio signal and output it from speakers.

The original acoustic properties of acoustic musical instruments are, however, not readily electrically reproduced. For example, the original acoustic properties of an acoustic guitar are lost in a pickup and use of a microphone is prone to cause howling. To output the sound of acoustic guitars with better sound quality from speakers, preamplifiers for acoustic guitars are conventionally used.

FIG. 7 is an illustration showing an appearance of a conventional preamplifier for acoustic guitars (trade name "ZOOM A3") and an outline of a signal process. A preamplifier 100 has side surfaces provided with, not shown, a pickup input terminal, a microphone input terminal, and an output terminal. The pickup input terminal or the microphone input terminal is connected to a pickup or a microphone attached to an acoustic guitar, not shown. The output terminal is connected to, for example, a guitar amplifier or a public address (PA) system.

Here, the sound of the acoustic guitar itself has a wide dynamic range. Commercially distributed pickups and microphones for acoustic guitars have a different output level of analog audio signal for each product. The preamplifier 100 thus has to amplify (including noninverting and inverting amplification, hereinafter the same) the inputted analog audio signal to an appropriate level. Accordingly, the preamplifier 100 is provided with a pickup input gain knob 101 and a microphone input gain knob 102. These gain knobs 101 and 102 are manually operated to change an amplification factor of an input operational amplifier 104 built in the preamplifier 100.

The inputted analog audio signal inputted to the preamplifier 100 is amplified by the input operational amplifier 104 and then converted to a digital audio signal by an A/D converter, not shown. A digital signal processor (DSP) 105 built in the preamplifier 100 implements processing to change a tone timbre of the digital audio signal. The digital audio signal after the tone timbre processing is converted to an analog audio signal by a D/A converter, not shown.

At this point, the tone timbre processing described above raises or lowers the level of the digital audio signal, and as a result, also raises or lowers the level of the analog audio signal finally outputted from the preamplifier 100. The analog audio signal thus has to be amplified to, before outputted from the preamplifier 100, an appropriate level. The preamplifier 100 is accordingly provided with an output volume knob 103. The output volume knob 103 is controlled to change an amplification factor of an output operational amplifier 106 built in the preamplifier 100. The output operational amplifier 106 amplifies the analog audio signal finally outputted from the preamplifier 100 to an appropriate signal level.

PRIOR ART DOCUMENT

Patent Document

Patent Document 1: Japanese Patent Application Kokai Publication No. 2008-076758
Patent Document 2: Japanese Patent Application Kokai Publication No. 2006-208954

SUMMARY OF THE INVENTION

As described above, to control the sound volume outputted from speakers, such a conventional preamplifier for acoustic guitars has a configuration provided with two knobs of an input gain knob and an output volume knob. To optimize the sound volume outputted from speakers, the operation has to be made to optimally combine the control results of the two knobs. For a user without expert knowledge, it has been difficult to optimally control the sound volume.

That is, the input gain knob is to control the input level of the preamplifier, and the control result influences the input sensitivity of the preamplifier. In contrast, the output volume knob is to control the final output level of the preamplifier, and the control result influences the sound volume outputted from speakers. As just described, the two knobs are different from each other in the technical significance of signal amplification. Accordingly, it is difficult for a user of the preamplifier to optimally control the sound volume without understanding at least the technical significance of the two knobs.

In particular, acoustic guitars are capable of making a sound without electrical amplification. Many acoustic guitar players are thus not familiar with electrical control operation of, for example, effectors, amplifiers for musical instruments, PA systems, and the like. For such an acoustic guitar player, it is extremely difficult to optimally operate each of the two knobs. Such a problem of operability can arise for players of, not limited to acoustic guitars, other acoustic musical instruments.

The present invention has been made in view of the above problems and it is an object thereof to provide a preamplifier for musical instruments allowing easy control of both an input level and an output level by manually operating a single operation unit.

(1) To achieve the above object, a preamplifier for musical instruments of the present invention includes: an operational amplifier to amplify an inputted analog audio signal; a variable resistor to change an amplification factor of the operational amplifier by manually operating an operation unit; an A/D converter to convert the amplified analog audio signal to a digital audio signal; and an arithmetic processing unit to digital-signal process the digital audio signal, wherein the variable resistor is provided with a detection mechanism to output a detection signal in accordance with an amount of operation of the operation unit, and the arithmetic processing unit is capable of implementing, based on a value of the detection signal, a first digital gain process to amplify the digital audio signal and/or a second digital gain process to attenuate the digital audio signal.

(2) It is preferred that, in the preamplifier for musical instruments according to (1) above, the arithmetic processing unit is capable of implementing processing to change a tone timbre of the digital audio signal, implements the first digital gain process in a timing before the processing, and implements the second digital gain process in a timing after the processing.

(3) It is preferred that, in the preamplifier for musical instruments according to (1) or (2) above, the operation unit has a predetermined range of motion, and the amplification factor of the operational amplifier becomes 1 when the operation unit is set in a central position of the range of motion, the amplification factor of the operational amplifier becomes greater than 1 when the operation unit is operated in one direction from the central position, and the amplification factor of the operational amplifier becomes less than 1 when the operation unit is operated in another direction from the central position, and the arithmetic processing unit implements the first digital gain process when the operation unit is operated in the one direction from the central position and the value of the detection signal becomes a first threshold or greater, and implements the second digital gain process when the operation unit is operated in the other direction from the central position and the value of the detection signal becomes a second threshold or less, which is less than the first threshold.

(4) It is preferred that, in the preamplifier for musical instruments according to (3) above, the arithmetic processing unit implements neither the first nor second digital gain processes when the value of the detection signal becomes less than the first threshold and greater than the second threshold.

(5) It is preferred that, in the preamplifier for musical instruments according to any one of (1) to (4) above, the arithmetic processing unit is capable of implementing a limiter process to attenuate the digital audio signal when a level of the digital audio signal subjected to the processing becomes a third threshold or greater.

(6) It is preferred that, in the preamplifier for musical instruments according to (5) above, the arithmetic processing unit implements the second digital gain process in a timing after the limiter process.

(7) It is preferred that, in the preamplifier for musical instruments according to any one of (1) to (6) above, the variable resistor is a dual-unit variable resistor including a rotary operation unit and first and second variable resistors to change a resistance by manually operating the rotary operation unit, the first variable resistor changing the amplification factor of the operational amplifier and the second variable resistor outputting an analog detection signal in accordance with the amount of operation of the rotary operation unit.

(8) It is preferred that, in the preamplifier for musical instruments according to (7) above, the rotary operation unit has a range of motion from 0° to 300°, and the amplification factor of the operational amplifier becomes 1 when an angle of rotation of the rotary operation unit is 150°, the amplification factor of the operational amplifier becomes greater than 1 when the rotary operation unit is rotated in a direction from 150° to 300°, and the amplification factor of the operational amplifier becomes less than 1 when the rotary operation unit is rotated in a direction from 150° to 0°, and the arithmetic processing unit implements the first digital gain process when the angle of rotation of the rotary operation unit becomes above 200°, and implements the second digital gain process when the angle of rotation of the rotary operation unit becomes below 100°.

(9) It is preferred that, in the preamplifier for musical instruments according to any one of (1) to (8) above, the arithmetic processing unit is a digital signal processor (DSP).

(10) It is preferred that, in the preamplifier for musical instruments according to any one of (1) to (9) above, to the operational amplifier, the analog audio signal obtained from an acoustic guitar is inputted.

(11) It is preferred that, in the preamplifier for musical instruments according to (10) above, the arithmetic processing unit is capable of implementing the processing suitable for acoustic guitars.

(12) It is preferred that, in the preamplifier for musical instruments according to (11) above, the processing simulates acoustic properties of at least one of a plurality of body types, a plurality of model types, and wood types of acoustic guitar.

The preamplifier for musical instruments of the present invention allows easy control of both an input level and an output level by manually operating a single operation unit. That is, in the preamplifier for musical instruments of the present invention, the value of the detection signal indicating the amount of operation of the operation unit is provided to the arithmetic processing unit. When the operation unit is manually operated, the operational amplifier amplifies the inputted analog audio signal inputted from a pickup or a microphone by an amplification factor in accordance with the amount of operation of the operation unit. The input level of the preamplifier is thus controlled. After that, the arithmetic processing unit implements the first and/or second digital gain process to the A/D converted digital audio signal based on the value of the detection signal. The final output level of the preamplifier is thus controlled.

The first digital gain process amplifies a digital audio signal to compensate a shortage of sound volume of the analog audio signal. Such an amplification process allows, for example, optimization of the final output sound volume of a passive pickup with no built-in amplification circuit. In contrast, the second digital gain process allows rapid attenuation of a digital audio signal and rendering the final output sound volume zero.

In particular, the present invention is preferably applied to a preamplifier for acoustic guitars. In a conventional preamplifier for acoustic guitars, the input level has to be controlled by manually operating an input gain knob and the final output level has to be controlled by manually operating an output volume knob. Application of the present invention to a preamplifier for acoustic guitars allows reduction in the number of knobs to one and the final output level is automatically controlled based on the amount of operation of the operation unit. Such configuration allows control of both the input level and the final output level with optimum combination by extremely easy manual operation.

DESCRIPTION OF THE INVENTION

A description is given below to a preamplifier for acoustic guitars as one embodiment of the present invention with reference to drawings.

Figure 1:
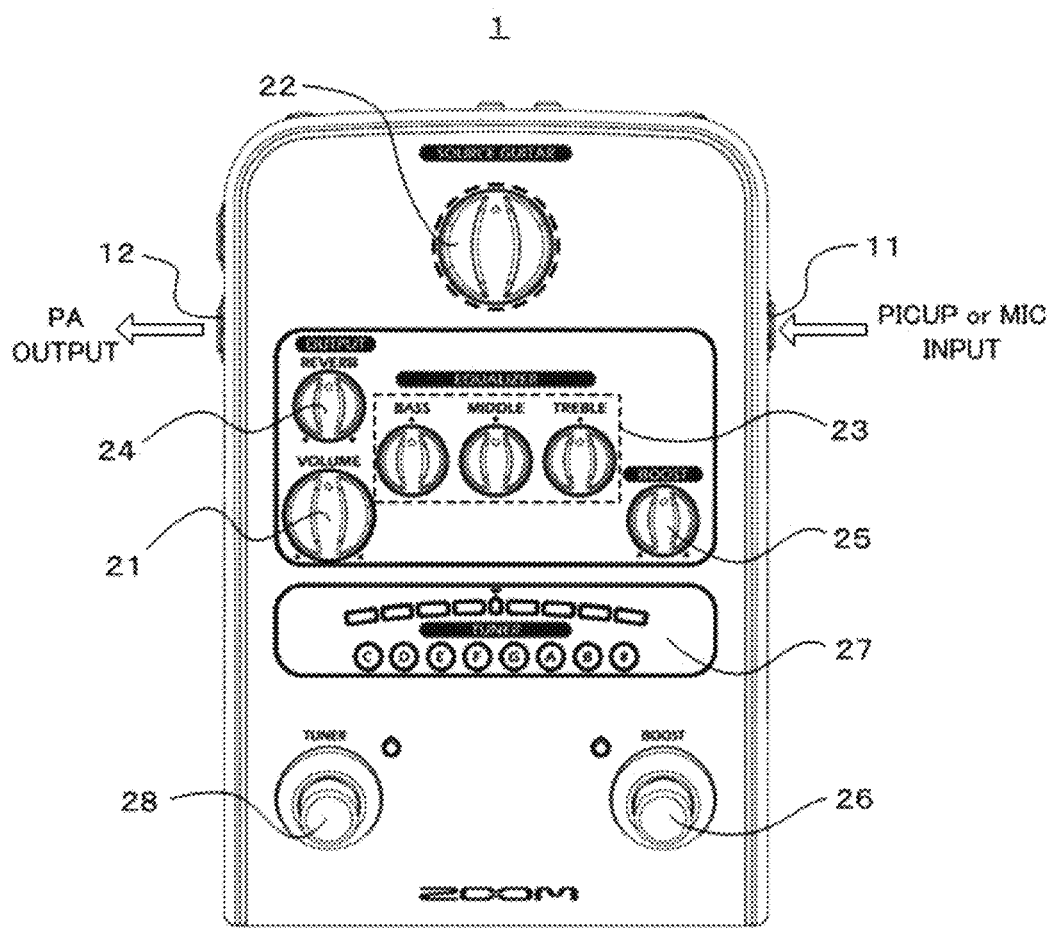
FIG. 1 is a top view illustrating an appearance of a preamplifier for acoustic guitars according to one embodiment of the present invention.

FIG. 1 is a top view illustrating an appearance of a preamplifier 1 for acoustic guitars in this embodiment. The preamplifier 1 is provided with an input terminal 11 and an output terminal 12 on both side surfaces. The input terminal 11 is connected to a pickup or a microphone, not shown. Such a pickup or a microphone is attached to an acoustic guitar, not shown. Meanwhile, the output terminal 12 is connected to, for example, a guitar amplifier or a PA system.

The pickup converts vibration of the strings of the acoustic guitar to an electrical signal. In contrast, the microphone converts sound (air vibration) of the acoustic guitar to an electrical signal. At this point, in the present embodiment, the electrical signal outputted from the pickup or the microphone is referred to as "an analog audio signal". In addition, the electrical signal generated by A/D conversion of the analog audio signal is referred to as "a digital audio signal". "The analog audio signal" also includes an electrical signal generated by D/A conversion of the digital audio signal.

Figure 4:
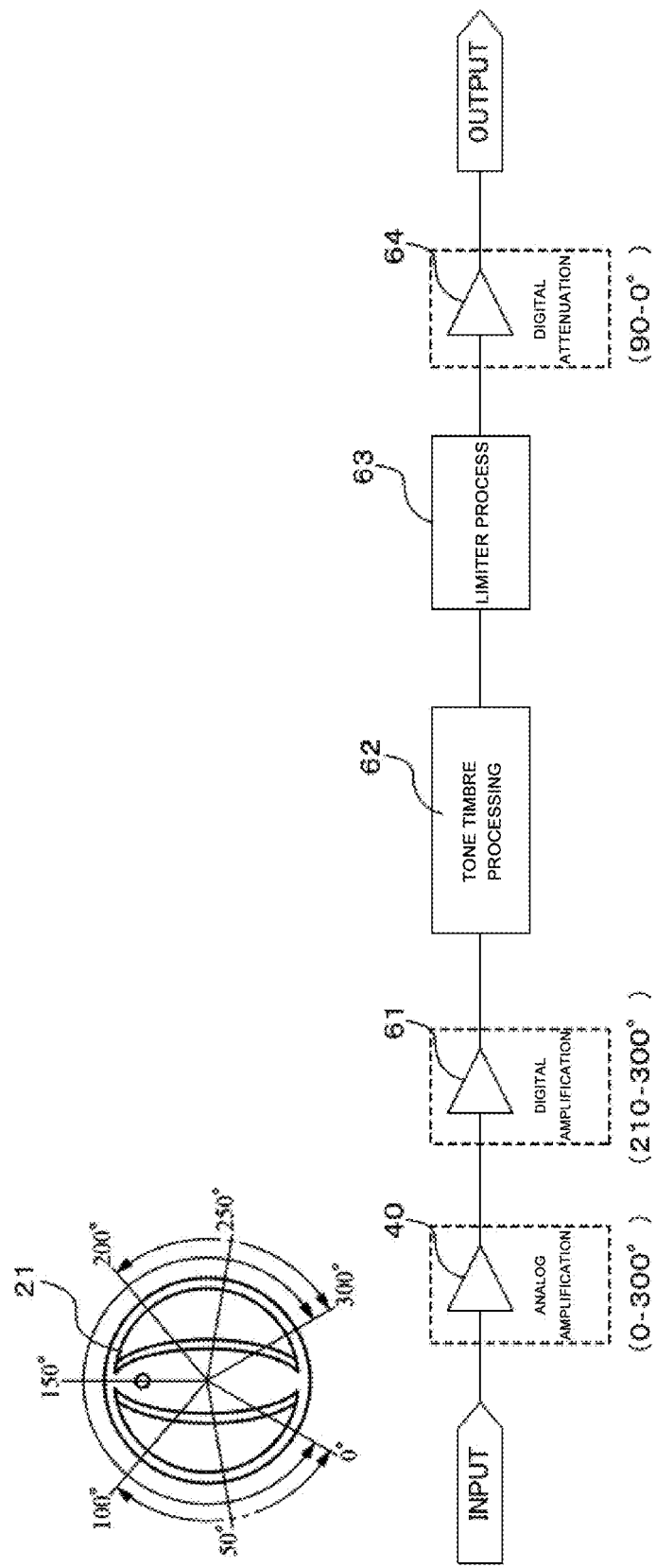
FIG. 4 is an illustration showing an angle of rotation of a volume knob and an outline of a signal process of the preamplifier.

The preamplifier 1 implements analog and digital signal processes exemplified in FIG. 4 to an inputted analog audio signal inputted to the input terminal 11. Main signal processes of the preamplifier 1 include analog amplification, digital amplification, tone timbre processing, limiter, and digital attenuation. The signal-processed analog audio signal is outputted from the output terminal 12 to a guitar amplifier or a PA system. The sound of an acoustic guitar controlled by the preamplifier 1 is thus outputted from speakers.

<Operation Unit>

In FIG. 1, the preamplifier 1 is provided with a plurality of knobs (rotary operation units) to control various signal processes on an upper surface. A volume knob 21 is to control an amplification factor of the inputted analog audio signal inputted to the input terminal 11. A selector knob 22 is to select a type of acoustic modeling, which is one example of the tone timbre processing. Equalizer knobs 23 are to control equalization effects, which are examples of the tone timbre processing. The equalizer knobs 23 include three knobs to control the respective frequency properties of a low register, a middle register, and a high register. A reverb knob 24 is to control a reverb effect, which is one example of the tone timbre processing. A boost knob 25 is to set an increase or a decrease in sound volume when a boost switch 26 is turned on.

<Tuner>

The preamplifier 1 in the present embodiment is provided with a tuner to tune the musical interval of each string of an acoustic guitar. Turning on/off the tuner is switched by a tuner switch 28. A user turns on the tuner and plays an open string to be tuned. Then, a tuner display 27 visually displays the name of the note close to the sound of the open string and the pitch of the sound of the open string being on or off key.

<Main Circuit Configuration>

Figure 2:
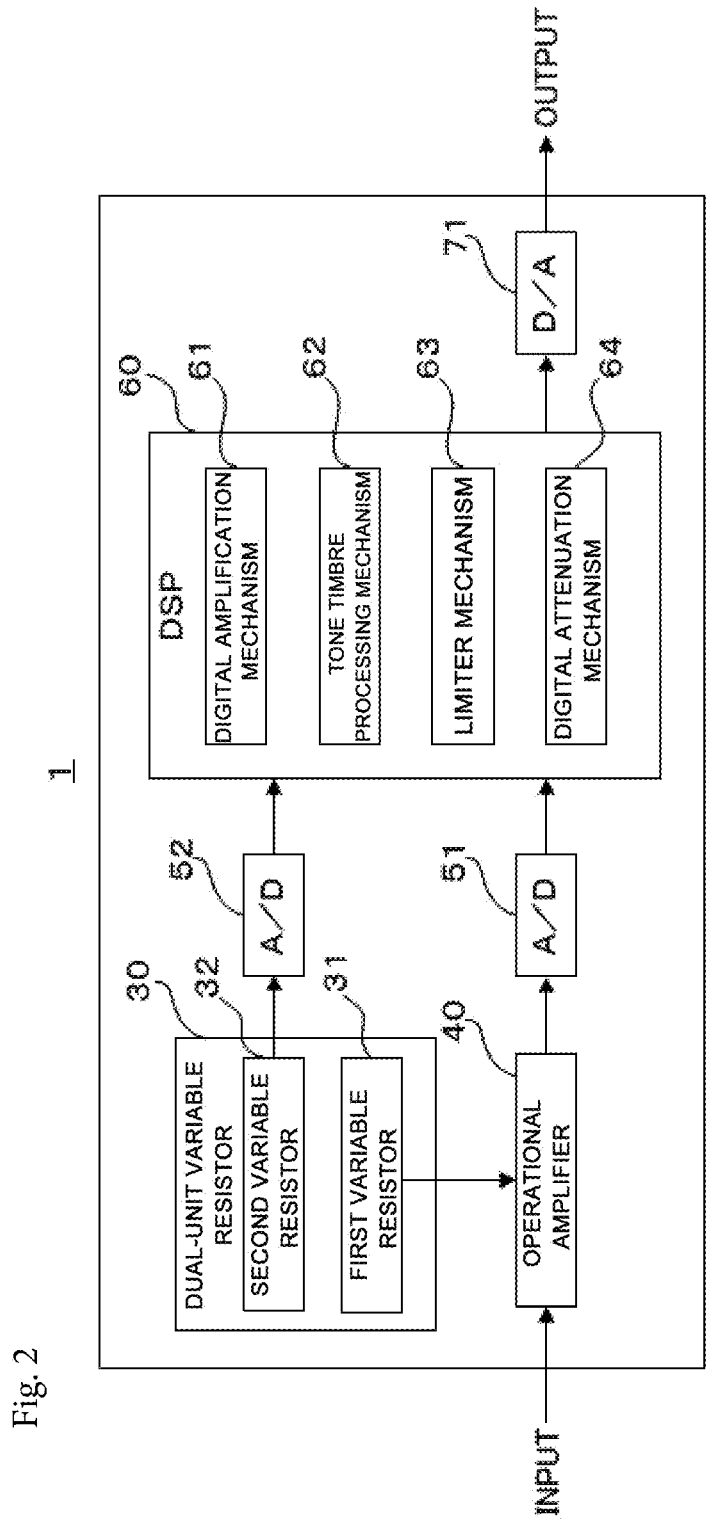
FIG. 2 is a block diagram illustrating a main circuit configuration of the preamplifier.

FIG. 2 is a block diagram illustrating a main circuit configuration of the preamplifier 1. The circuit of the preamplifier 1 includes a dual-unit variable resistor 30, an operational amplifier 40, two A/D converters 51 and 52, a digital signal processor 60, and a D/A converter 71.

The operational amplifier 40 amplifies the inputted analog audio signal inputted to the preamplifier 1. The amplification factor of the operational amplifier 40 is determined by the dual-unit variable resistor 30. The dual-unit variable resistor 30 is provided with first and second variable resistors 31 and 32.

Figure 3:
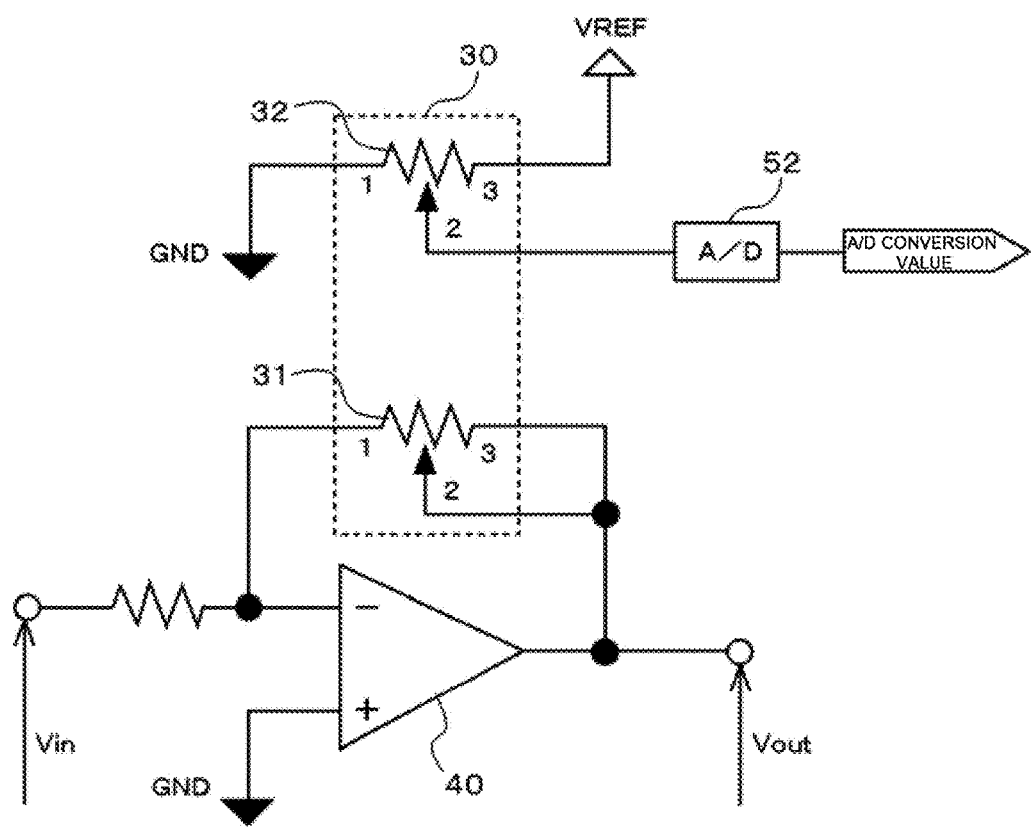
FIG. 3 is a circuit diagram illustrating a dual-unit variable resistor configuring the preamplifier.

FIG. 3 is a circuit diagram illustrating the dual-unit variable resistor 30. Each of the first and second variable resistors 31 and 32 has a resistor and a slider moving on the resistor. Each slider of the first and second variable resistors 31 and 32 is provided on a common pivot, not shown. To this pivot, the volume knob 21 illustrated in FIG. 1 is attached. With rotation of the volume knob 21, the slider moves on the resistor to change the resistances of the first and second variable resistors 31 and 32.

In addition, each of the first and second variable resistors 31 and 32 has three terminals labeled with "1", "2", and "3" in FIG. 3. All of the three terminals of the first variable resistor 31 are connected to the operational amplifier 40. That is, the first variable resistor 31, together with the operational amplifier 40, configures an analog amplification circuit. In accordance with the angle of rotation of the volume knob 21, the resistance of the first variable resistor 31 is changed. This changes the amplification factor of an output voltage $V_{out}$ to an input voltage $V_{in}$. The analog audio signal amplified by the operational amplifier 40 is converted to a digital audio signal by the A/D converter 51 illustrated in FIG. 2.

Meanwhile, the terminal "1" of the second variable resistor 32 is connected to the GND, and the terminal "2" is connected to the A/D converter 52. To the terminal "3" of the second variable resistor 32, a reference voltage $V_{REF}$ is applied. In accordance with the angle of rotation of the volume knob 21, the resistance of the second variable resistor 32 is changed. This changes the voltage applied to the terminal "2" of the second variable resistor 32. This voltage is converted to a digital numerical value by the A/D converter 52. The A/D conversion value of the A/D converter 52 corresponds to the angle of rotation of the volume knob 21.

As illustrated in FIG. 2, both the A/D converters 51 and 52 are connected to the digital signal processor (DSP) 60. By implementing firmware to digital-signal process a digital audio signal, the digital signal processor 60 functions as a digital amplification mechanism 61, a tone timbre processing mechanism 62, a limiter mechanism 63, and a digital attenuation mechanism 64.

The digital amplification mechanism 61 implements a first digital gain process to amplify the digital audio signal based on the A/D conversion value of the A/D converter 52. The tone timbre processing mechanism 62 implements processing to change a tone timbre of the digital audio signal based on operation of the selector knob 22, the equalizer knobs 23, and the reverb knob 24 illustrated in FIG. 1. The limiter mechanism 63 implements a limiter process to attenuate the digital audio signal when the digital audio signal subjected to the processing has a level of a predetermined threshold or greater. The digital attenuation mechanism 64 implements a second digital gain process to attenuate the digital audio signal based on the A/D conversion value of the A/D converter 52. Details of the above digital-signal processes are described later.

The digital signal processor (DSP) 60 is connected to the D/A converter 71. The D/A converter 71 converts the digital audio signal subjected to the digital-signal process by the digital signal processor 60 again to an analog audio signal.

<Relationship Between Volume Knob and Signal Process by Preamplifier>

The preamplifier 1 in the present embodiment is characterized in that both the input level and the output level are controlled by manually operating the single volume knob 21. The relationship between the volume knob 21 and the signal process by the preamplifier 1 is described below with reference to FIGS. 4 and 6.

Figure 6:
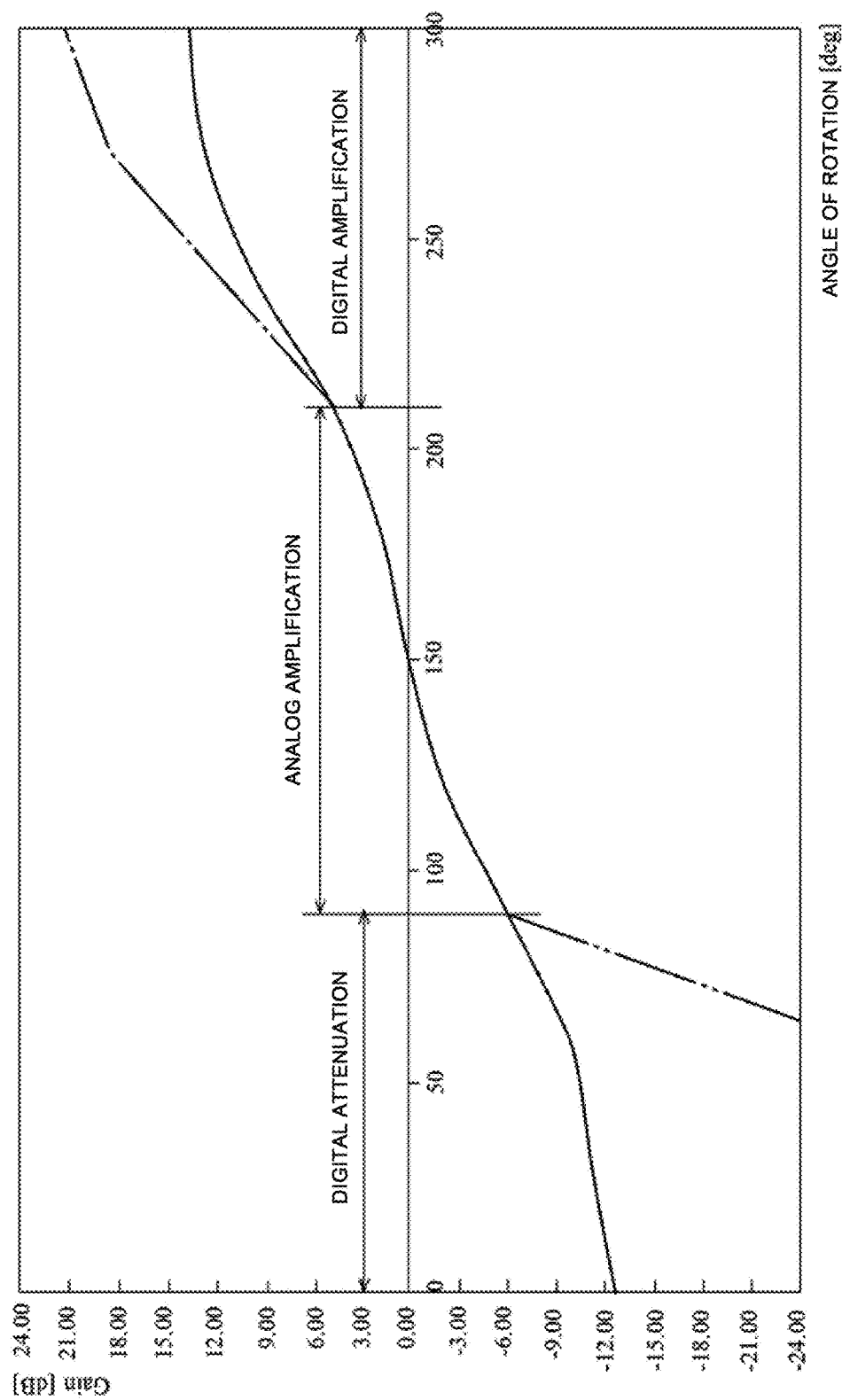
FIG. 6 is a graph illustrating relationship of the gain to the angle of rotation of the volume knob.
Figure 7:
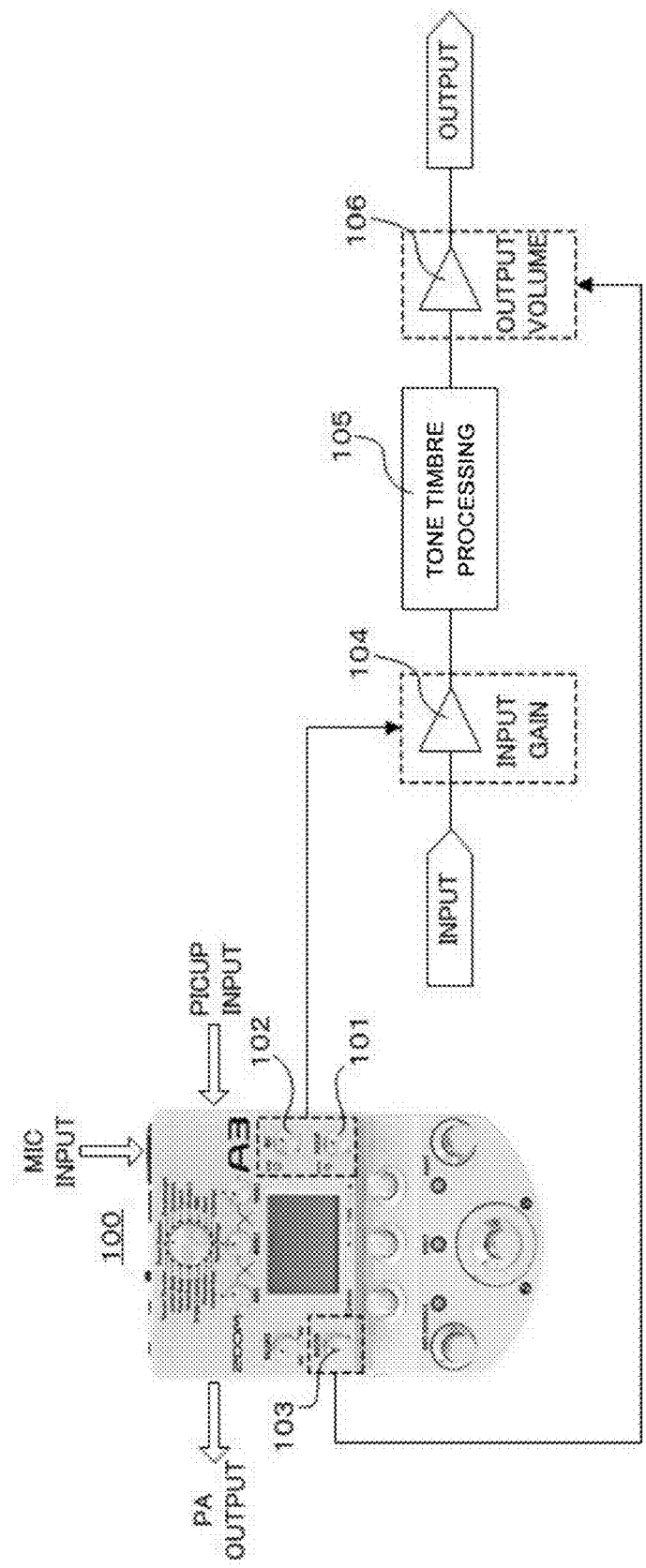
FIG. 7 is an illustration showing an appearance of a conventional preamplifier for acoustic guitars and an outline of a signal process.

FIG. 4 is an illustration showing the angle of rotation of the volume knob 21 and an outline of the signal process by the preamplifier 1. FIG. 6 is a graph illustrating relationship of the gain [dB] to the angle [deg] of rotation of the volume knob 21. The solid line in FIG. 6 indicates analog amplification properties of the operational amplifier 40. The dash dotted line in FIG. 6 indicates digital amplification properties of the digital amplification mechanism 61. The dash double-dotted line in FIG. 6 indicates digital attenuation properties of the digital attenuation mechanism 64.

<<Analog Amplification>>

As illustrated in FIG. 4, the inputted analog audio signal inputted to the preamplifier 1 is firstly analog amplified by the operational amplifier 40. The input sensitivity of the preamplifier 1 is determined by the amplification factor of the operational amplifier 40. As described above, the amplification factor of the operational amplifier 40 is changed in accordance with the resistance of the first variable resistor 31 based on the angle of rotation of the volume knob 21. The volume knob 21 in the present embodiment has a range of motion from 0° to 300°.

As illustrated with the solid line in FIG. 6, when the angle of rotation of the volume knob 21 is 150°, the amplification factor of the operational amplifier 40 becomes 1. That is, the inputted analog audio signal inputted to the preamplifier 1 is not amplified by the operational amplifier 40.

Then, when the volume knob 21 is rotated in the direction from 150° to 300°, the amplification factor of the operational amplifier 40 becomes greater than 1. That is, the inputted analog audio signal inputted to the preamplifier 1 is noninverted amplified by the operational amplifier 40.

On the contrary, when the volume knob 21 is rotated in the direction from 150° to 0°, the amplification factor of the operational amplifier 40 becomes less than 1. That is, the inputted analog audio signal inputted to the preamplifier 1 is inverted amplified by the operational amplifier 40.

<<Digital Amplification>>

The analog-amplified analog audio signal is converted to a digital audio signal by the A/D converter 51. As illustrated in FIG. 4, the digital amplification mechanism 61 selectively digital amplifies the digital audio signal based on the angle of rotation of the volume knob 21. As described above, the angle of rotation of the volume knob 21 is detected by a change in voltage of the second variable resistor 32.

As illustrated with the dash dotted line in FIG. 6, in the present embodiment, a first threshold of the angle of rotation of the volume knob 21 is set at 210°. When the angle of rotation of the volume knob 21 is from 210° to 300°, the digital amplification mechanism 61 implements digital amplification (first digital gain process) of the digital audio signal. Such digital amplification increases the level of the analog audio signal finally outputted from the preamplifier 1.

<<Tone Timbre Processing, Limiter Process>>

The tone timbre processing and the limiter process illustrated in FIG. 4 are not implemented based on the angle of rotation of the volume knob 21. The tone timbre processing mechanism 62 implements the tone timbre processing of the digital audio signal based on angles of rotation of the selector knob 22, the equalizer knobs 23, and the reverb knob 24. When the level of the digital audio signal after the tone timbre processing becomes a predetermined threshold or greater, the limiter mechanism 63 implements the limiter process to attenuate the digital audio signal.

<<Digital Attenuation>>

As illustrated in FIG. 4, the digital attenuation mechanism 64 selectively digital attenuates the digital audio signal based on the angle of rotation of the volume knob 21. As described above, the angle of rotation of the volume knob 21 is detected by the second variable resistor 32.

As illustrated with the dash double-dotted line in FIG. 6, in the present embodiment, a second threshold of the angle of rotation of the volume knob 21 is set at 90°. When the angle of rotation of the volume knob 21 is from 90° to 0°, the digital attenuation mechanism 64 implements digital attenuation (second digital gain process) of the digital audio signal. Such digital attenuation reduces the level of the analog audio signal finally outputted from the preamplifier 1.

<Flow of Signal Process>

The flow of the signal process by the preamplifier 1 is then described with reference to the flowchart in FIG. 5.

Figure 5:
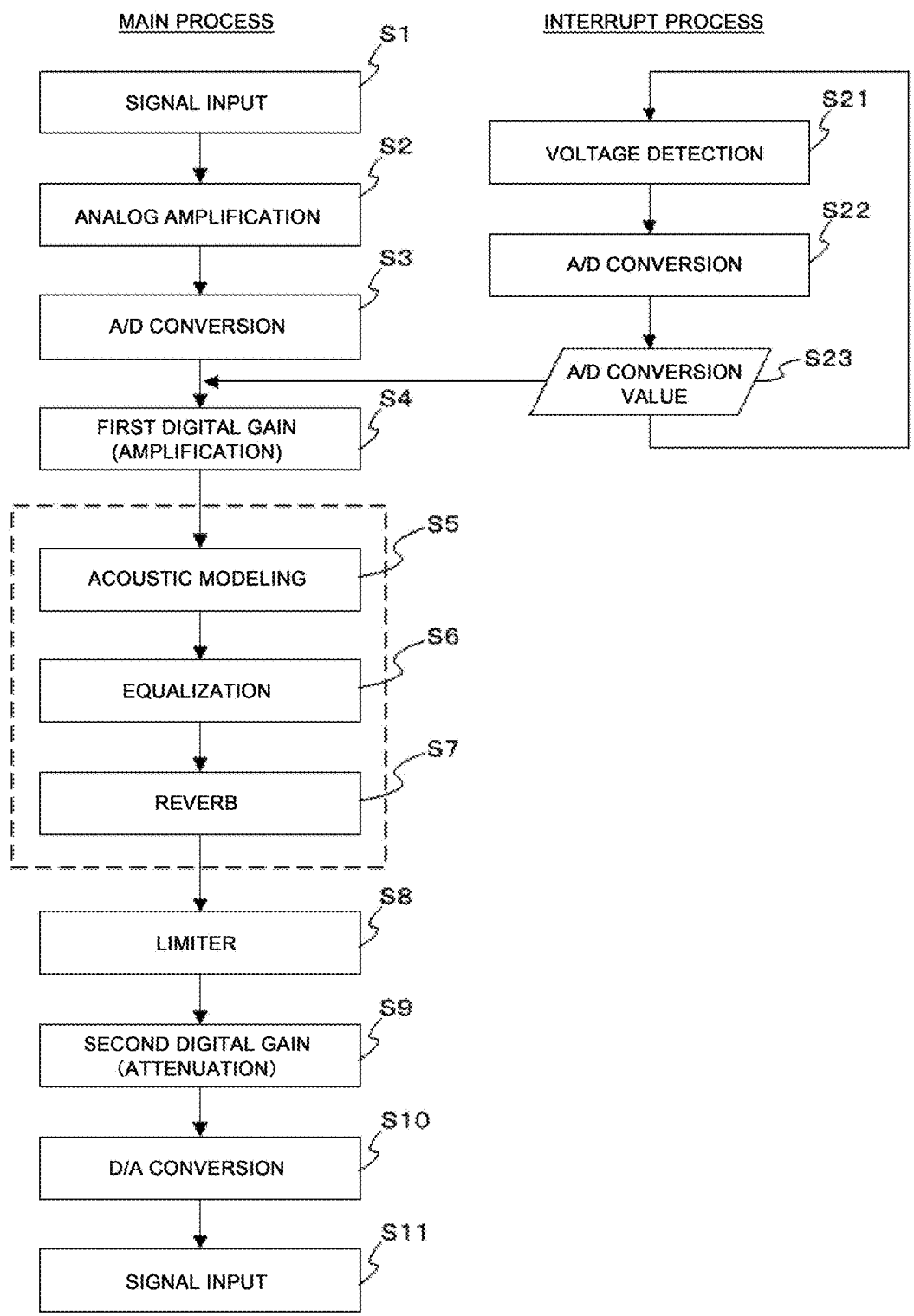
FIG. 5 is a flowchart illustrating details of the signal process of the preamplifier.

As illustrated in FIG. 5, the signal process by the preamplifier 1 includes a main process composed of steps S1 to S11 and an interrupt process composed of steps S21 to S23. The main process is a signal process implemented between the input of the analog audio signal to the preamplifier 1 and the output of the signal. The interrupt process is a signal process implemented at fixed intervals to obtain the A/D conversion value indicating the angle of rotation of the volume knob 21.

At step S1 in the main process, the analog audio signal outputted from a pickup or a microphone is inputted to the preamplifier 1 via the input terminal 11. At step S2, the inputted analog audio signal inputted to the preamplifier 1 is analog amplified by the operational amplifier 40. As described above, the amplification factor of the operational amplifier 40 is changed in accordance with the resistance of the first variable resistor 31 based on the angle of rotation of the volume knob 21 from 0° to 300°. At step S3, the analog-amplified analog audio signal is converted to a digital audio signal by the A/D converter 51. This digital audio signal is sent to the digital signal processor 60.

Now, steps S21 to S23 of the interrupt process is described. At step S21, the angle of rotation of the volume knob 21 from 0° to 300° is detected by the voltage changed in accordance with the resistance of the second variable resistor 32. At step S22, the detected voltage is converted to a digital numerical value by the A/D converter 52. At step S23, the A/D conversion value indicating the angle of rotation of the volume knob 21 is sent to the digital signal processor 60. Sending and receiving of the A/D conversion value at step S23 are repeated at fixed intervals of 28 [msec].

At step S4 in the main process, the digital signal processor 60 (digital amplification mechanism 61) determines whether or not the angle of rotation of the volume knob 21 is 210° or greater based on the A/D conversion value received from the A/D converter 52. If the angle of rotation of the volume knob 21 is 210° or greater, the digital signal processor 60 digital amplifies (first digital gain process) the digital audio signal by the amplification factor corresponding to the A/D conversion value. As illustrated in FIG. 6, digital amplification at step S4 is implemented when the angle of rotation of the volume knob 21 is from 210° to 300°.

All steps S5 to S7 in the main process are specific examples of the tone timbre processing implemented by the digital signal processor 60 (tone timbre processing mechanism 62). In the acoustic modeling process at step S5, effects simulating the acoustic properties exhibited by a body type, a model type, and a wood type of an actual acoustic guitar are applied to the digital audio signal. Selection of the body type, the model type, and the wood type is performed by the selector knob 22 illustrated in FIG. 1. In the equalization process at step S6, the respective frequency properties of a low register, a middle register, and a high register of the digital audio signal are controlled based on the angle of rotation of the three equalizer knobs 23 illustrated in FIG. 1. In the reverb process at step S7, a reverb effect is applied to the digital audio signal based on the angle of rotation of the reverb knob 24 illustrated in FIG. 1.

At step S8 in the main process, when the level of the digital audio signal after the tone timbre processing becomes a predetermined threshold or greater, the digital signal processor 60 (limiter mechanism 63) attenuates the digital audio signal. The limiter process at step S8 allows suppression of the sound volume of the analog audio signal finally outputted from the preamplifier 1 to less than the predetermined threshold.

At step S9 in the main process, the digital signal processor 60 (digital attenuation mechanism 64) determines whether or not the angle of rotation of the volume knob 21 is 90° or less based on the A/D conversion value received from the A/D converter 52. If the angle of rotation of the volume knob 21 is 90° or less, the digital signal processor 60 digital attenuates (second digital gain process) the digital audio signal. As illustrated in FIG. 6, the digital attenuation at step S4 is implemented when the angle of rotation of the volume knob 21 is from 90° to 0°.

The amount of attenuation in the digital audio signal does not have to be proportional to the angle of rotation of the volume knob 21 from 90° to 0°. For example, when the angle of rotation of the volume knob 21 exceeds 60°, the level of the digital audio signal may be zero.

At step S10 in the main process, the D/A converter 71 converts the digital audio signal generated by the digital-signal process by the digital signal processor 60 again to an analog audio signal. This analog audio signal is outputted from the preamplifier 1 via the output terminal 12 to a guitar amplifier or a PA system.

<Actions and Effects of Preamplifier>

The preamplifier 1 in the present embodiment allows easy control of both an input level and an output level by manually operating the single volume knob 21. That is, in the preamplifier 1 of the present embodiment, the A/D conversion value indicating the angle of rotation of the volume knob 21 is provided to the digital signal processor 60 (S21 to S23). As the volume knob 21 is manually operated, the operational amplifier 40 amplifies the inputted analog audio signal inputted from a pickup or a microphone by the amplification factor in accordance with the angle of rotation of the volume knob 21 (S2). The input level of the preamplifier 1 is thus controlled. After that, the digital signal processor 60 implements the first or second digital gain process based on the A/D conversion value to the A/D converted digital audio signal (S4 or S9). The final output level of the preamplifier 1 is thus controlled.

The first digital gain process (S4) compensates a shortage of sound volume of the analog audio signal by amplifying the digital audio signal. Such an amplification process allows optimization of, for example, the final output sound volume of a passive pickup with no built-in amplification circuit. In contrast, the second digital gain process (S9) allows rapid attenuation of the digital audio signal and rendering the final output sound volume zero.

The present invention is preferably applied to the preamplifier 1 for acoustic guitars as in the present embodiment. In a conventional preamplifier for acoustic guitars, the input level has to be controlled by manually operating input gain knobs and the final output level had to be controlled by manually operating an output volume knob. The preamplifier 1 for acoustic guitars in the present embodiment achieves the single volume knob 21 and the final output level automatically controlled based on the angle of rotation of the volume knob 21 (S4, S9, and S23). Such a configuration allows control of both the input level and the final output level with optimum combination by extremely easy manual operation.

<Modifications>

The preamplifier for musical instruments of the present invention is not limited to the preamplifier 1 for acoustic guitars in the present embodiment described above. For example, the present invention is applicable to a preamplifier for, not only acoustic guitars, but also acoustic musical instruments such as wind instruments, stringed instruments, percussion instruments, and keyboard instruments. The operation units of the variable resistor are not limited to rotary types but may be altered to, for example, sliding type. The mechanism to detect the amount of operation of the operation unit is not limited to a dual-unit variable resistor. For example, an optical detection mechanism, such as an encoder, may be provided to the operation unit of a single variable resistor.

REFERENCE SIGNS LIST

1 Preamplifier for Musical Instruments
11 Input Terminal
12 Output Terminal
21 Volume Knob (Rotary Operation Unit)
22 Selector Knob
23 Equalizer Knob
24 Reverb Knob
25 Boost Knob
26 Boost Switch
27 Tuner Display
28 Tuner Switch
30 Dual-Unit Variable Resistor
31 First Variable Resistor
32 Second Variable Resistor (Detection Mechanism)
40 Operational Amplifier
51, 52 A/D Converter
60 Digital Signal Processor (Arithmetic Processing Unit)
61 Digital Amplification Mechanism
62 Tone Timbre Processing Mechanism
63 Limiter Mechanism
64 Digital Attenuation Mechanism
71 D/A Converter

The invention claimed is:

1. A preamplifier for musical instruments, comprising:
an operational amplifier configured to amplify an inputted analog audio signal;

a variable resistor configured to change an amplification factor of the operational amplifier by manually operating an operation unit;

an A/D converter configured to convert the amplified analog audio signal to a digital audio signal; and an arithmetic processing unit configured to digital-signal process the digital audio signal, wherein the variable resistor is provided with a detection mechanism configured to output a detection signal in accordance with an amount of operation of the operation unit, and the arithmetic processing unit is configured to implement, based on a value of the detection signal, a first digital gain process configured to amplify the digital audio signal and/or a second digital gain process configured to attenuate the digital audio signal.

2. The preamplifier for musical instruments according to claim 1, wherein the arithmetic processing unit is configured to: implement processing to change a tone timbre of the digital audio signal; implement the first digital gain process in a timing before the processing; and implement the second digital gain process in a timing after the processing.

3. The preamplifier for musical instruments according to claim 1, wherein the operation unit has a predetermined range of motion, and the amplification factor of the operational amplifier becomes 1 when the operation unit is set in a central position of the range of motion, the amplification factor of the operational amplifier becomes greater than 1 when the operation unit is operated in one direction from the central position, and the amplification factor of the operational amplifier becomes less than 1 when the operation unit is operated in another direction from the central position, and the arithmetic processing unit is configured to: implement the first digital gain process when the operation unit is operated in the one direction from the central position and the value of the detection signal becomes a first threshold or greater; and implement the second digital gain process when the operation unit is operated in the other direction from the central position and the value of the detection signal becomes a second threshold or less, which is less than the first threshold.

4. The preamplifier for musical instruments according to claim 3, wherein the arithmetic processing unit is configured to implement neither the first nor second digital gain processes when the value of the detection signal becomes less than the first threshold and greater than the second threshold.

5. The preamplifier for musical instruments according to claim 1, wherein the arithmetic processing unit is configured to implement a limiter process to attenuate the digital audio signal when a level of the digital audio signal subjected to the processing becomes a third threshold or greater.

6. The preamplifier for musical instruments according to claim 5, wherein the arithmetic processing unit is configured to implement the second digital gain process in a timing after the limiter process.

7. The preamplifier for musical instruments according to claim 1, wherein the variable resistor is a dual-unit variable resistor including a rotary operation unit and first and second variable resistors configured to change a resistance by manually operating the rotary operation unit, the first variable resistor changing the amplification factor of the operational amplifier and the second variable resistor outputting an analog detection signal in accordance with the amount of operation of the rotary operation unit.

8. The preamplifier for musical instruments according to claim 7, wherein the rotary operation unit has a range of motion from 0° to 300°, and the amplification factor of the operational amplifier becomes 1 when an angle of rotation of the rotary operation unit is 150°, the amplification factor of the operational amplifier becomes greater than 1 when the rotary operation unit is rotated in a direction from 150° to 300°, and the amplification factor of the operational amplifier becomes less than 1 when the rotary operation unit is rotated in a direction from 150° to 0°, and the arithmetic processing unit is configured to: implement the first digital gain process when the angle of rotation of the rotary operation unit becomes above 200°; and implement the second digital gain process when the angle of rotation of the rotary operation unit becomes below 100°.

9. The preamplifier for musical instruments according to claim 1, wherein the arithmetic processing unit is a digital signal processor (DSP).

10. The preamplifier for musical instruments according to claim 1, wherein the analog audio signal obtained from an acoustic guitar is inputted to the operational amplifier.

11. The preamplifier for musical instruments according to claim 10, wherein the arithmetic processing unit is configured to implement the processing associated with acoustic guitars.

12. The preamplifier for musical instruments according to claim 11, wherein the processing simulates acoustic properties of at least one of the following: a plurality of body types; a plurality of model types; wood types of acoustic guitar, or any combination thereof.

13. The preamplifier for musical instruments according to claim 2, wherein the analog audio signal obtained from an acoustic guitar is inputted to the operational amplifier.

14. The preamplifier for musical instruments according to claim 3, wherein the analog audio signal obtained from an acoustic guitar is inputted to the operational amplifier.

15. The preamplifier for musical instruments according to claim 4, wherein the analog audio signal obtained from an acoustic guitar is inputted to the operational amplifier.

16. The preamplifier for musical instruments according to claim 5, wherein the analog audio signal obtained from an acoustic guitar is inputted to the operational amplifier.

17. The preamplifier for musical instruments according to claim 6, wherein the analog audio signal obtained from an acoustic guitar is inputted to the operational amplifier.

18. The preamplifier for musical instruments according to claim 7, wherein the analog audio signal obtained from an acoustic guitar is inputted to the operational amplifier.

19. The preamplifier for musical instruments according to claim 8, wherein the analog audio signal obtained from an acoustic guitar is inputted to the operational amplifier.

20. The preamplifier for musical instruments according to claim 9, wherein the analog audio signal obtained from an acoustic guitar is inputted to the operational amplifier.

* * * * *